PHOTOLITHOGRAPHY APPARATUS AND METHOD

Filed Feb. 6, 1968

INVENTOR
K.M. POOLE
BY
R.B. Anderson
ATTORNEY 3,558,222
PHOTOLITHOGRAPHY APPARATUS AND METHOD Kenneth M. Poole, Bernardsville, N.J., assignor to Bell Telephone Laboratories, Incorporated, Murray Hill, N.J., a corporation of New York Filed Feb. 6, 1968, Ser. No. 703,452
Int. Cl. G03b 27/32
U.S. Cl. 355—18 3 Claims

ABSTRACT OF THE DISCLOSURE

A photolithographic mask is registered with a pattern contained on the surface of a semiconductor wafer coated with photoresist material by reflecting light to which the photoresist is insensitive from the wafer surface and imaging the wafer surface onto the mask by means of a primary lens and a supplementary lens, observing the mask and the wafer surface pattern simultaneously through a microscope, and moving the mask to register it with respect to the wafer surface pattern. The supplementary lens is then removed and light of a frequency to which the photoresist is photosensitive is directed through the mask and imaged by the primary lens onto the wafer surface. The focal length of the primary and supplementary lens together at the frequency used during registration is substantially equal to the focal length of the primary lens alone at the optical frequency used during photographic exposure of the photoresist.

BACKGROUND OF THE INVENTION

Figure 1:
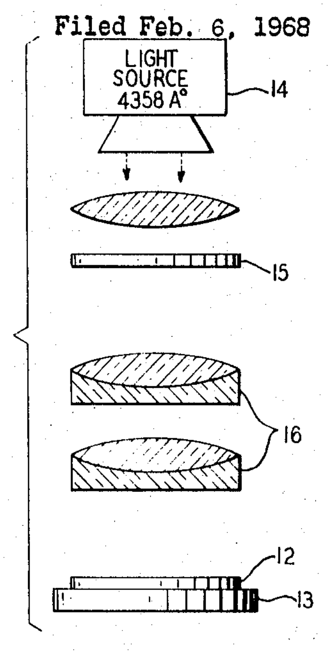

In the fabrication of semiconductor devices by photolithographic techniques, a semiconductor wafer is coated with a photosensitive film, sometimes referred to as photoresist, and exposed to light projected through a mask. Development of the selectively exposed photoresist, followed by etching and diffusion into the wafer, allows the degree and type of conductivity of the wafer to be modified in accordance with the photographically printed pattern on the photoresist. Modern semiconductor fabrication often requires that several such printing steps be performed successively, with each exposure to the mask being in precisely controlled registration with the previously formed configurations on the wafer. Because the patterns in the mask and the patterns on the wafer may have extremely small dimensions, sometimes in the order of 0.1 mil, a microscope is normally required for registering the mask with the wafer.

The copending application of K. M. Poole, Ser. No. 678,422, filed Oct. 26, 1967, and assigned to Bell Telephone Laboratories, Incorporated, describes a photolithographic technique in which the mask overlays the upper surface of the wafer, but is displaced from the wafer by a distance sufficient to avoid abrading the photoresist coating. The application points out that with the high power microscopes required for registering extremely small mask patterns, the normal microscope depth of field is smaller than the distance between the mask and the wafer surface, and consequently, the wafer pattern and the mask cannot simultaneously be observed in focus. The solution offered is to use a microscope having a dual lens system, one being focused on the mask and the other focused on the wafer surface, with the two images being superimposed so that the operator can see them both in focus while registering the mask with the wafer pattern.

SUMMARY OF THE INVENTION

In accordance with the present invention, a lens is included between the wafer and the mask for imaging the wafer surface onto the mask during the registration step. Since the image of the wafer surface can be superimposed on the mask itself, both the wafer surface and the mask can be simultaneously observed in focus through a high power microscope having a very limited depth of field. After the mask has been appropriately registered, the photoresist coating is exposed by projecting light through the mask and lens onto the wafer surface. With the mask being appropriately imaged onto the wafer surface, the photoresist coating will be properly exposed and in condition for further processing.

The technique described above requires that during the alignment step the coated wafer be exposed to light of a frequency to which the photoresist is insensitive; thus, there must be a rather large difference of the optical frequencies used during the registration step and during the exposure step. Unfortunately, because of unavoidable lens aberrations, the focal length and magnification of the imaging lens is a function of optical frequency. Consequently, if a given lens is suitable for imaging the wafer surface onto the mask at the optical frequency used during registration, it may be unsuitable for imaging the mask onto the wafer surface during the exposure step. Precise imaging during the registration step is required so that both the wafer surface and the mask will be within the microscope depth of field, and likewise, the exposure step requires precise imaging so that the exposed pattern on the photoresist coating will be sharply defined.

In accordance with the invention this problem is avoided by using a supplementary lens together with a primary imaging lens during the registration step to compensate for the difference in optical frequency used during registration and during exposure. The registration step is made with both the primary and the supplementary lens included between the wafer and the mask, but the exposure step is made with only the primary imaging lens. The primary imaging lens and the supplementary lens are designed so that together they will image the wafer surface onto the mask at the optical frequency used during registration, and, at the frequency used during exposure, the primary imaging lens by itself will image the mask onto the wafer surface. Since the primary lens is used during both steps, whatever lens aberrations are present during the exposure step are also present during the registration step. This avoids registration problems that might develop if different lenses with completely different aberrations were used during exposure as were used during registration.

DRAWING DESCRIPTION

Figure 2:
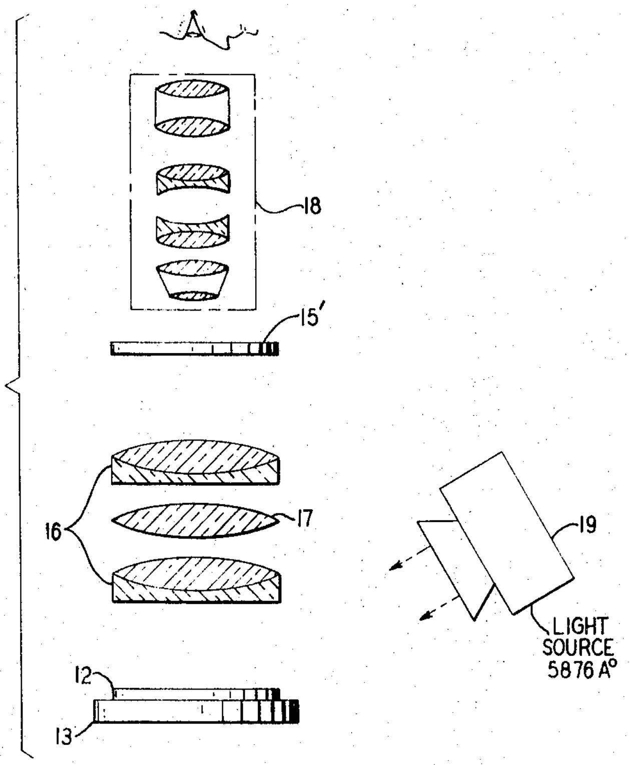

These and other objects, features, and advantages of the invention will be better understood from a consideration of the following detailed description taken in conjunction with the accompanying drawing in which:

FIG. 1 is a schematic illustration of apparatus for exposing a photoresist coating in accordance with an illustrative embodiment of the invention; and FIG. 2 is a schematic illustration of apparatus for registering the mask prior to the exposure step depicted in FIG. 1.

DETAILED DESCRIPTION

Referring now to FIG. 1, there is shown apparatus for photographically exposing a photoresist coating 12 on an upper surface of a semiconductor wafer 13. Only selected portions of the coating 12 are exposed by directing light from a source 14 through a mask 15 and lenses 16. Transparent portions of the mask 15 form an intricate pattern (not shown) which is imaged by primary lens system 16 onto the photoresist coating 12. The light must be of a wavelength to which the photoresist coating is photosensitive; in this case, a typical wavelength of 4,358 angstroms is used. After the exposure step, the protoresist film is developed, selectively etched, and used as a mask to control subsequent processing of the wafer 13, such as selective etching or selective impurity diffusion into the wafer 13. After processing, the upper surface of the wafer contains a visible pattern which corresponds to the pattern on mask 15. In order to reduce mask tolerances, it is preferred that lens 16 have a magnification of from 3 to 20.

As mentioned before, manufacturing processes such as integrated circuit fabrication typically require a number of exposure or printing steps to be performed successively on each semiconductor wafer. This in turn requires that the mask such as mask 15' be registered precisely with respect to patterns that have already been formed on the wafer surface.

Apparatus in accordance with the invention for registering mask 15' with respect to patterns on the surface of wafer 13 is shown in FIG. 2. The primary lens 16 and a supplementary lens 17 images the upper surface of the wafer onto the mask 15'. The mask and the wafer are then simultaneously observed through a microscope 18 and the mask 15' is moved to a proper location with respect to the wafer. Thereafter, the supplementary lens 17 and the microscope 18 are removed so that the photoresist can be exposed by directing light of 4,358 angstroms through mask 15' as shown generally in FIG. 1.

During the registration step the coated wafer must be illuminated by light from a source 19 which will not photographically expose the photoresist coating 12. For example, light having a wavelength of 5,876 angstroms may be used to illuminate known photoresist films which are sensitive to light of the wavelength 4,358 angstroms. However, because of unavoidable aberrations in the primary lens 16, the focal length and magnification of the lens 16 will not be precisely the same at 5,876 angstroms as it is at 4,358 angstroms. As mentioned before, it is important that in the step of FIG. 1 the mask 15 be imaged precisely on the photoresist coating 12, so that the exposure of the coating will be sharply defined, and likewise, it is important in the step of FIG. 2 that the upper surface of the wafer be precisely imaged on the mask 15' so that both the wafer surface and the mask will be within the limited depth of field of the microscope 18. Consequently, the supplementary lens 17 is required to compensate for the difference in optical frequency used during the registration and exposure steps.

The supplementary lens 17 is designed such that the lens system consisting of primary lens 16 and supplementary lens 17 has a focal length at 5,876 angstroms which is substantially equal to the focal length of the primary lens system by itself at 4,358 angstroms. In practice, this can be accomplished by first designing the primary lens 16 such that it has a proper focal length $F_1$ for imaging the mask 15 onto the wafer surface at the exposing wavelength. One next determines the focal length $F_2$ of the primary lens at the registration wavelength (in this case 5,876 angstroms). Supplementary lens 17 is then designed to have a focal length $f_2$ at the registration frequency which is given by $$\frac{1}{f_2}=\frac{1}{F_1}-\frac{1}{F_2} \qquad (1)$$

Equation 1 is a first order of approximation which is made by assuming that the primary and supplementary lenses are thin lenses and that they act together in the registration step as a single lens; that is, the spacing between them is negligible. To approximate this assumption as closely as possible, it is preferred that lenses 16 and 17 be in as close proximity to each other as is reasonably convenient. Precise design of the lenses to account for such parameters as their physical thicknesses and actual spacings involve matters within the ordinary skill of a worker in the art. With the thin lens approximation, compensation for focal length variations with optical frequency also compensates for magnification variations with optical frequency.

Of course it would be possible to compensate for the optical frequency differences by using a lens in the registration step that is different from the lens used in the exposure step. The use of a supplementary lens as described, however, is strongly preferred because the aberrations of the primary lens 16 used during the registration are also present during exposure. If completely different lens systems were used, unavoidable lens aberrations could result in misalignments because each of the two lens systems would be subject to different aberrations. It can be shown that, with the frequencies described, and with straightforward lens design, the aberrations contributed by the supplementary lens 17 will be substantially negligible, and the total aberrations during exposure will be substantially the same as those during registration. As another alternative, it is apparent that one could use the supplementary lens 17 only in the exposure step, rather than in the registration step as has been described.

The various embodiments presented are intended only to be illustrative of the inventive concept. Various other embodiments and modifications may be made by those skilled in the art without departing from the spirit and scope of the invention.

What is claimed is:

1. In a photolithography process for fabricating electronic devices from a substrate, the steps of:
- reflecting light of a first frequency from a substrate surface coated with a photosensitive material that is insensitive to light of the first frequency;
- projecting the reflected light through a first lens system such as to form a real image of the substrate surface at the plane of a planar mask;
- observing the mask and the real image through a microscope and simultaneously registering the mask with respect to the substrate surface;
- inserting a supplementary lens in the path of light of a second frequency, thereby to form a second lens system, the focal length of the second lens system at the second frequency being appropriate for forming a real image of the mask on the substrate surface; and
- exposing the photosensitive coating by projecting light of the second frequency through the mask and the lens system and the supplementary lens onto the substrate surface, the photosensitive coating being sensitive to the second frequency light, and wherein:
  - the first lens system has a focal length $F_1$ at the first frequency and a second focal length $F_2$ at the second frequency;
  - and the supplementary lens has a focal length $f_2$ at the second frequency which substantially conforms to the relation $$\frac{1}{f_2}=\frac{1}{F_1}-\frac{1}{F_2}$$

2. In photolithography apparatus for fabrication of electronic devices from a substrate, the combination comprising:
- means for reflecting light of a first frequency from a substrate surface coated with a photosensitive material that is insensitive to light of the first frequency;
- means comprising a first lens system for projecting the reflected light such as to form a real image of the substrate surface at the plane of a planar mask;
- means comprising a microscope for observing the mask and real image, thereby to permit registering of the mask and the lens system onto the substrate surface;
- the photosensitive coating being sensitive to light of the second frequency;
- means for compensating for a difference in focal length of the lens system at the first and second frequencies comprising a supplementary lens insertable in the path of light of the second frequency;

the combined focal length of the lens system and the supplementary lens being such as to form a real image of the mask on the substrate surface.

3. The combination of claim 2 wherein:

the first lens system has a focal length $F_1$ at the first frequency and a second focal length $F_2$ at the second frequency;

and the supplementary lens has a focal length $f_2$ at the second frequency which substantially conforms to the relation $$\frac{1}{f_2}=\frac{1}{F_1}-\frac{1}{F_2}$$

References Cited

UNITED STATES PATENTS

| | | | |
|---|---|---|---|
| 1,820,494 | 8/1931 | Rennick | 355—70 |
| 2,184,831 | 12/1939 | Campbell | 355—71X |

JOHN M. HORAN, Primary Examiner